United States Patent [19]

Grossi

[11] 4,008,942
[45] Feb. 22, 1977

[54] PRINTED CIRCUIT BOARD HOLDING SPRING

[75] Inventor: Benedetto Grossi, Norwalk, Conn.

[73] Assignee: General Signal Corporation, Rochester, N.Y.

[22] Filed: July 29, 1975

[21] Appl. No.: 600,171

[52] U.S. Cl. .......................... 339/91 R; 339/17 M; 361/388; 361/397
[51] Int. Cl.² .................... H01R 13/54; H05K 1/14
[58] Field of Search ........ 339/17 L, 17 LC, 17 LM, 339/17 M, 75 MP, 176 MP, 91 R; 317/101 DH; 211/41

[56] References Cited

UNITED STATES PATENTS

| | | | |
|---|---|---|---|
| 2,802,188 | 8/1957 | Badders | 339/176 MP X |
| 2,825,037 | 2/1958 | French | 339/75 MP |
| 3,278,714 | 10/1966 | Bernutz | 339/17 L |
| 3,486,159 | 12/1969 | Matthews | 339/91 R X |
| 3,539,879 | 11/1970 | Bradley et al. | 317/101 DH |
| 3,567,998 | 3/1971 | Ammerman | 317/101 DH |
| 3,693,135 | 9/1972 | Vavrick et al. | 317/101 DH X |
| 3,803,533 | 4/1974 | Taplin | 339/176 MP X |
| 3,932,016 | 1/1976 | Ammenheuser | 317/101 DH X |

Primary Examiner—Roy Lake
Assistant Examiner—E. F. Desmond
Attorney, Agent, or Firm—Milton E. Kleinman; George W. Killian

[57] ABSTRACT

An economical guide, holding and support means for a printed circuit board is disclosed. The holding or support means may be fabricated of spring steel and may be supported at one end by the same fastening means that fastens the printed circuit board connector to its mounting surface. The holding means includes a groove or a perforation for providing three directional edge support of the printed circuit board. A notch may be provided on the printed circuit board whereby the holding means may serve as a releasable lock for retaining the printed circuit board. The openness of the holding and support means provides for improved air circulation and, therefore, a reduced chance of component overheating. The support means may also be used to provide a ground connection to the supported printed circuit board and/or to complete a test or continuity circuit by switch actuation or circuit completion.

4 Claims, 9 Drawing Figures

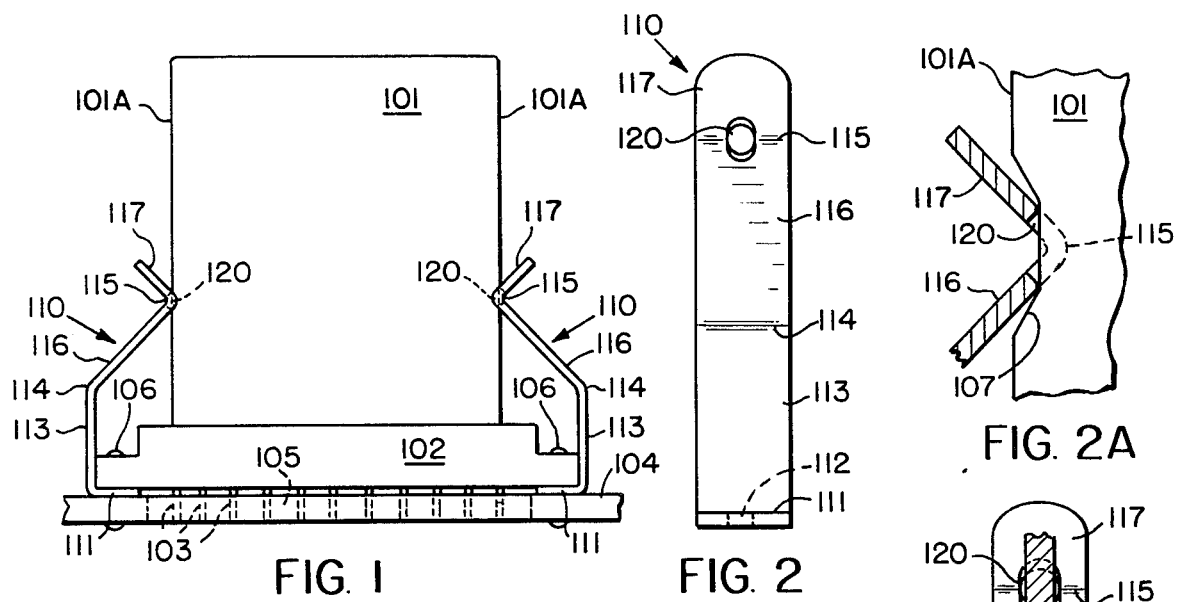
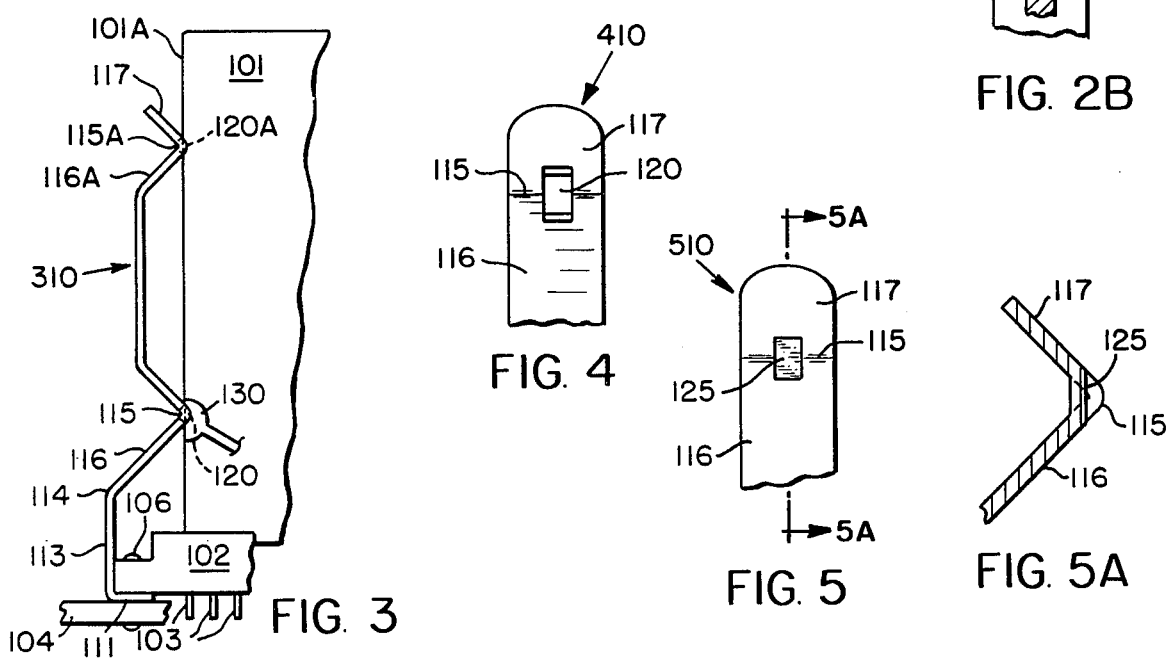
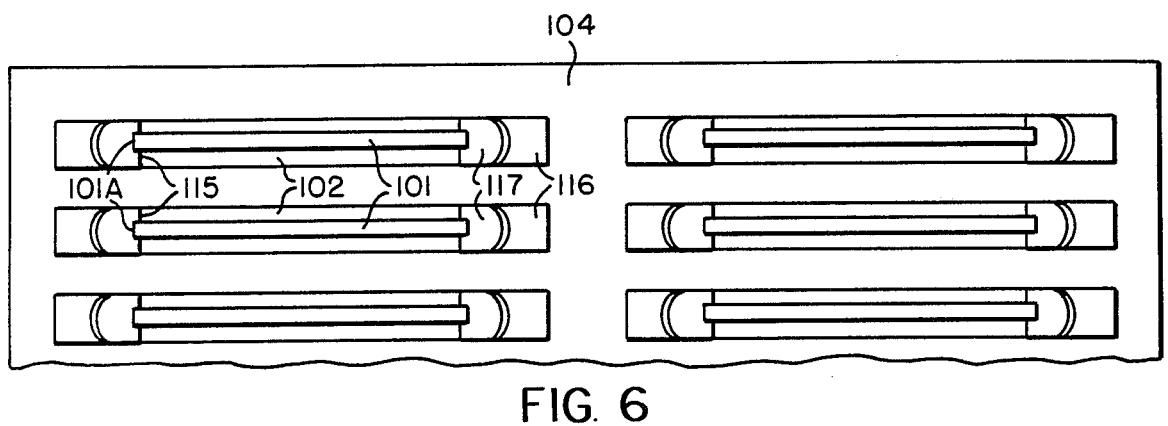

PRINTED CIRCUIT BOARD HOLDING SPRING

BACKGROUND OF THE INVENTION

Printed circuit boards were nearly unkown only a little more than a score of years ago. Now they are reqularly used in such diverse products as radios and ranges; watches and washing machines; computers and clocks or TV sets and telephones. Printed circuit boards come in a wide variety of shapes, sizes and configurations. In many products, such as computers, communication systems, industrial process control systems, and/or many other applications, it is frequently necessary to provide several dozen printed circuit boards, some of which may be indentical to others, while others may vary in both size and circuit configuration. For efficient space utilization, it is generally desirable to package as many printed circuit boards, and other components of the system, in a minimum volume. This creates a variety of ancillary problems, including the fact that it may be difficult or impossible to see into certain areas to inspect for fault conditions. The close proximity of the printed circuit boards and other components introduces two other potential problems which are solved by the present invention. One of these problems relates to the heat that is generated when electrical components are densely packed, thereby increasing the possibility for heat to build up and cause damage. This possibility is increased if the density and packaging configuration limits air circulation. The other problem that arises with densely packed components is that there may be inadvertent physical contact between elements which should not be in contact and that such inadvertent contact may introduce errors or cause serious damage to the equipment. The probability of inadvertent contact is aggravated when the clearances are small and there is any possibility of movement of one element relative to another.

Typically, printed circuit boards are substantially planar with small elements or components mounted thereon. The conductors on the printed circuit board are usually arranged in a group at a projection near one edge of the board and the projection plugs into a connector. Wiring between the plurality of connectors, and other components, provides the necessary interconnections between the printed circuit boards and the components thereon. The most common sizes for printed circuit boards of the type presently under discussion range from approximately the size of a small index card to approximately the size of a sheet of typing paper. Depending upon the size and weight of a printed circuit board and its orientation and proximity to other cards and components, the card may be supported solely by the projection that plugs into the connector. If other support is not provided, it is easy to visualize how the printed circuit boards may move if the apparatus is subjected to a blow or vibration. Any such movement might result in the aforementioned inadvertent contact between elements on adjacent printed circuit boards and/or other elements mounted nearby. An obvious solution to this problem is to provide edge supports and guides to eliminate, or at least minimize, the extent of the motion which may take place. This solution is entirely practical and many types of edge supports have been provided. However, it should be immediately apparent that the use of edge supports obviously adds to the cost, weight and size of the total structure. In addition, the use of edge supports aggravates the potential danger of overheating for at least the reason that the edge supports tend to limit air circulation.

Various solutions have been suggested to minimize the overheating problems while still providing adequate support. These solutions include mounting the printed circuit boards so that their planes are substantially vertical, rather than horizontal, so that the possibility of cooling by convection air currents is improved. In addition, blowers have been employed to provide forced air cooling. Also, a wide variety of edge supports have been provided to try to provide the required support while still allowing as much air circulation as possible.

One typical support method may be compared with the techniques used for supporting racks in a domestic oven where the printed circuit boards may be compared with the oven racks. The card supports in this analogy may be compared with the oven walls and may be slotted or perforated to permit some air to circulate. Another widely used system comprises a U-shaped channel which supports an edge of the printed curcuit card and which may be supported at each end by some means which provides as much support as is practical without totally inhibiting all air circulation.

SUMMARY OF THE INVENTION

The invention disclosed herein comprises a new convenient and economical means for providing support for printed circuit boards to protect them from excessive movement in response to shock or vibration without introducing any significant impediment to the circulation of air. The auxiliary support, in its most economical and convenient form, comprises a piece of spring steel which is appropriately formed for mounting together with, or near, the connector into which the printed circuit board is plugged and for providing point contact on an edge of the printed circuit board to support it and restrain its movement. In one form of the invention, the piece of spring steel will have a small hole punched therethrough, and thereafter, the spring steel will be bent along a diameter of the hole which is at right angles to the length of the support member. As a result, a recess is formed in the support member, or holding spring, for coacting with an edge of the printed circuit card and limiting the motion of the printed circuit card in the direction of the diameter of the circle through which the bend was made. In an alternate embodiment of the invention, a rectangular cut-out or one of some other convenient shape may be used instead of the mentioned circular perforation. In another embodiment, a card supporting groove may be formed into the holding spring.

If desired, the printed circuit board may also be notched to mate with the shape of the support member. This would help determine when the board is fully and properly seated in its connector. Also, if desired, the support member may be used to complete an electrical connection when the printed circuit board is inserted into its connector. This connection could be completed by the support member actuating a microswitch mounted on the printed circuit board; or by completing a connection to a conducting area on the printed circuit board.

Normally, a support member, or holding spring, would be used to contact opposite points on parallel edges of a printed circuit card. The support provided will help prevent the card from moving from its normal plane to any parallel plane and will help minimize any sideways motion of the printed circuit card. Normally, the friction between the printed circuit board and its connector is sufficient to inhibit motion of the card in the direction of insertion and removal. However, particularly when the supporting member is used together with edge notches on the printed circuit card, the supporting members may provide additional means for inhibiting the motion of the printed circuit card in the direction of insertion and removal in response to shock and/or vibration.

The minimum contact of the supporting member with the printed circuit board permits maximum air circulation around the printed circuit boards and thereby considerably reduces the possibility of overheating.

In a typical assembly, a plurality of connectors might be placed in close proximity on a commmon surface, or a mother board, and the supporting members might be mounted to the common surface by the same means used for mounting the connector. However, the exigencies of a particular situation may require that the support means be fastened to the mother board by independent means.

Depending upon the particular circumstances, and-/or the size of the printed circuit board to be supported, it might be desirable to provide the support member with a plurality of bends so that it may contact an edge of the printed circuit board at more than one location.

The support member could contact an element on the printed circuit board and serve as a heat sink.

It is an object of the invention to provide a new and improved means for supporting and holding printed circuit boards.

It is another and more specific object of the invention to provide a new and improved means for supporting a printed circuit board which will not interfere with the circulation of air around the board.

It is another object of the invention to provide a new and improved printed circuit board holding spring which is simple and economical to manufacture.

It is another object of the invention to provide a new and improved support means for a printed circuit board which can be used to complete an electrical connection when the printed circuit board is placed in position.

It is another object of the invention to provide a support means for a printed circuit board which may be used for providing a ground connection to the printed circuit board.

It is another object of the invention to provide a holding spring which will prevent a printed circuit board from excessive motion in response to shock and-/or vibration and which will provide this feature without introducing a significant impediment to the circulation of air around the printed circuit board.

It is another object of the invention to provide a support means for a printed circuit board which could serve as a heat sink.

BRIEF DESCRIPTION OF THE DRAWING

FIG. 1 is a front view of a printed circuit board mounted in a connector and supported by the spring steel support means of the invention.

FIG. 2 is an enlarged front view of one of the spring steel support means shown in FIG. 1.

FIGS. 2A and 2B constitute enlarged views of selected portions of the support means.

FIG. 3 shows an alternate form of the spring steel support means and illustrates how the support means, or holding spring, may be used to make contact with a printed circuit area.

FIG. 4 shows an alternate form of a portion of the structure shown in FIG. 2.

FIG. 5 illustrates another alternate form of a portion of the structure shown in FIG. 2.

FIG. 5A is a cross section taken on line A—A of FIG. 5.

FIG. 6 illustrates how an array of connectors, printed circuit boards and their associated supports may be arranged on a mother board.

Corresponding elements are assigned the same identifying number in the different views. Elements which may not identically correspond, but which have similar functions, are assigned numbers which differ only in their first digit.

DESCRIPTION OF THE PREFERRED EMBODIMENT

Considering now more specifically FIG. 1, there will be seen a printed circuit board 101 which may have printed thereon a plurality of conduction areas and on which may be mounted a variety of electrical components. The conducting areas and components are not shown as they do not form a part of the present invention and their illustration would only tend to add unnecessary detail which would obscure the inventive concept. The printed circuit board 101 plugs into a connector 102, which is well known in the art, and which has a plurality of terminals 103 each of which may electrically communicate with a correspondingly positioned printed circuit area on the printed circuit board 101. The connector 102 is conventionally mounted on a chassis, or mother board, 104 which has an elongated slot 105 through which the terminals 103 may protrude so that external connections may be made to the terminals 103. The connector 102 is mounted on the chassis, or mother board, 104 by means of fastening means 106 which may comprise a rivet or any other convenient fastening means.

At each side of the printed circuit board 101 and fastened to the mother board 104, together with the connector 102 by the fastening means 106, is a support means, or holding spring, 110. Minor variations of the holding spring 110 are designated 310, 410 and 510 in FIGS. 3, 4 and 5, respectively. Each holding spring 110 includes a mounting portion 111 and mounting hole 112 (more clearly seen in FIG. 2). Mounting portion 111 may extend under the connector 102 and the fastening means 106 may pass through hole 112 for mounting the support means 110 to the mother board 104 together with the connector 102. If the size of the printed circuit board 101 should preclude this method of mounting the support means 110, the support means 110 could be displaced from the connector 102 and mounted by individual fastening means through the hole 112. This alternate mounting of the support means 110 may be readily visualized and is not specifically illustrated herein.

The support means 110 includes an upstanding portion 113, a formed angle 114 and a contact angle 115. Between the formed angle 114 and the contact angle 115 is a leg 116. Extending beyond the contact angle 115 is the terminus 117. The upstanding portion 113 may bear on the end of the connector 102 to maintain proper holding spring 110 orientation with respect to the connector 102 and the printed circuit board 101. If the holding spring 110 is displaced from the connector, another hole similar to 112 may be used to maintain proper orientation.

The support means 110 may most advantageously be fabricated by punching the member from flat sheet or strip stock and simultaneously therewith punching the mounting hole 112 and the support hole 120. Subsequent to this punching operation, the holding spring 110 may be formed to provide the formed angle 114 and the contact angle 115 and the mounting portion 111. The contact angle 115 should be formed through a centerline of the support hole 120. The diameter of the support hole 120, if it is round, or the width thereof if it is of a rectangular or oval shape, should slightly exceed the thickness of the printed circuit board 101. When the connector 102 and the support means 110 are mounted, as illustrated in FIG. 1, the support means 110 should have a slight bias towards the printed circuit card 101 so that as the printed circuit card 101 is inserted into the connector 102, the support means 110 will bear on and make contact with the edge 101A of the printed circuit board 101. These details are more clearly shown in FIGS. 2A and 2B. As with any structure for guiding and supporting printed circuit boards, the board 101 must have a predetermined width at the point of contact of the edge 101A with the contact angle 115. The contact between the upstanding portion 113 and the end of the connector 102 limits the excursion of the contact angle 115 when the printed circuit board 101 is not in position. As most clearly seen in FIG. 2B, the forming of the contact angle 115 distorts the support hole 120. Part of the boundary of the support hole 120 bears on the edge 101A of the printed circuit board 101 and helps restrain the printed circuit board 101 from motion in any direction except the direction of insertion and removal from the connector 102. That is, as viewed in FIG. 1, the support means, or holding spring, 110 and the support hole 120 co-act with the printed circuit board 101 to restrain its motion in either the left or right direction and also towards or away from the viewer. Thus, each support means provides three directional support. Instead of using a round hole as illustrated in FIGS. 1, 2, 2A and 2B, a rectangular hole could be used as illustrated in FIG. 4. Or, if desired, an oval shaped hole could be used. Or, alternatively, instead of punching a hole, a support groove 125 could be formed as the formed angle 114 and contact angle 115 are formed to fabricate the support means 110.

If desired, a detenting action could be provided by providing a notch 107 in the printed circuit board 101 as best shown in FIG. 2A. When the notch 107 is used, the support means 110 does provide some restraining force for inhibiting the motion of the printed circuit board in the direction for removal. Normally, the contact pressure between the contact elements of the connector 102 and the printed circuit board 101 provide an adequate restraining force.

Considering now more specifically FIG. 3, there is illustrated therein a variation of the support means 110 which is designated 310. In situations wherein the printed circuit board 101 is relatively large, it might be desired to provide a plurality of edge support points. This may be readily accomplished by providing multiple contact angles 115 and 115A as illustrated in FIG. 3. Multiple support holes 120 and 120A would also be used.

Situations may arise wherein it is desirable to complete an electrical connection from the support means 110 to the printed circuit board 101. This may be provided by including an appropriate printed circuit area 130 on the printed circuit board 101 so that the printed circuit area 130 can make contact with the support means 310. Normally, the contact area 130 should extend from one side of the board 101 around the edge and to the other side. Such contact might be used to ground the support means 110 and/or to provide shielding.

In addition, the support means 110 could be caused to contact a component and serve as a heat sink.

In many systems and assemblies, it is necessary to use a plurality of printed circuit boards. In such situations, an appropriate plurality of connectors 102 may be arranged in an array of rows and columns on a mother board 104 as illustrated in FIG. 6. In such situations, the support means 110 finds particular utility because they do not enclose the printed circuit board 101 and thereby prevent good air circulation between adjacent boards. Good air circulation is important on efficiently packed equipment in order to provide for adequate cooling and prevent overheating and damage to components mounted on the printed circuit board 101. Depending upon the amount of heat generated, the orientation of the printed circuit boards and the ambient temperature, adequate cooling may be obtained by forced air circulation or by convection currents.

While there has been shown and described what is considered at the present to be the preferred embodiment of the invention, modifications thereto will readily occur to those skilled in the related arts. It is believed that no further analysis or description is required and that the foregoing so fully reveals the gist of the present invention that those skilled in the applicable arts can adapt it to meet the exigencies of their specific requirements. It is not desired, therefore, that the invention be limited to the embodimnets shown and described, and it is intended to cover in the appended claims all such modifications as fall within the true spirit and scope of the invention.

What is claimed is:

1. In a printed circuit board mounting and support system of the class having a mother board supporting a connector into which one edge of a planar printed circuit board of predetermined thickness is plugged for effecting electrical connections from said printed circuit board to said connector and wherein the improvement comprises:

a. a formed resilient longitudinal retaining spring for supporting the printed circuit board from the edge and for limiting the motion of said printed circuit board towards parallel planes;
   b. said retaining spring having a bend formed thereon at right angles to the length of said retaining spring to form a "V"; and said retaining spring otherwise shaped, formed and supported by the mother board to permit only the vertex of said "V" to contact the edge of the printed circuit board in a line normal to the plane of said printed circuit board; and wherein
   c. at least some of the material of said retaining spring is displaced from the central part of said vertex for a width equal to, or slightly more than, said predetermined thickness for creating a groove whereby when said vertex area is in contact with the printed circuit board said printed circuit board is contacted on its edge and adjacent sides to limit motion of said printed circuit board towards parallel planes.

2. The combination as set forth in claim 1 and including a second retaining spring associated with a second edge of said printed circuit board.

3. The combination as set forth in claim 1, wherein said groove is formed by a perforation in said retaining spring.

4. The combination as set forth in claim 1 and including a second "V" and associated vertex and groove on said retaining spring for contacting and supporting the printed circuit board at two points.

* * * * *